United States Patent [19]
Brown et al.

[11] Patent Number: 5,545,893
[45] Date of Patent: Aug. 13, 1996

[54] OPTOCOUPLER PACKAGE AND METHOD FOR MAKING

[75] Inventors: Clem H. Brown, Scottsdale; John E. Salina, Phoenix, both of Ariz.

[73] Assignee: Motorola, Inc., Schaumburg, Ill.

[21] Appl. No.: 363,483

[22] Filed: Dec. 23, 1994

[51] Int. Cl.$^6$ .......................... H01J 40/14; G02B 27/00
[52] U.S. Cl. .......................... 250/239; 250/551; 257/81; 257/99
[58] Field of Search .................................. 250/551, 239; 257/80, 81, 678, 99, 100; 174/52.2, 52.4

[56] References Cited

U.S. PATENT DOCUMENTS

| | | | |
|---|---|---|---|
| 3,845,318 | 10/1974 | Thillays | 250/551 |
| 3,891,858 | 6/1975 | Schöberl | 250/551 |
| 5,148,243 | 9/1992 | Merrick et al. | 250/551 |
| 5,171,985 | 12/1992 | Kawaguchi | 250/239 |
| 5,340,993 | 8/1994 | Salina et al. | |

*Primary Examiner*—Georgia Y. Epps
*Assistant Examiner*—Jacqueline M. Steady
*Attorney, Agent, or Firm*—Aaron B. Bernstein; George C. Chen

[57] ABSTRACT

An optocoupler package (40) has two pre-molded thermoplastic halves (42, 54); one containing the emitter (16) and the other containing the detector (18). The detector half (54) has a well (56) where the detector (54) is located. The well (56) is filled with silicon die coat gel (24). The emitter half (42) has a similar well (48) containing the emitter. Surrounding the well (48) of the emitter half is a protruding wall (50) with relief vents (52). The wall (50) is configured to fit into the perimeter of the well (56) of the detector package half (54). When the package (40) is assembled, the protruding wall (50) of the emitter half (42) is inserted into the well (56) of the detector package half (54), thereby displacing the gel (24) so as to completely fill the internal chamber (66) and spill into the relief vents (52).

23 Claims, 4 Drawing Sheets

OPTOCOUPLER PACKAGE AND METHOD FOR MAKING

FIELD OF THE INVENTION

The present invention relates, in general, to photoelectric devices, and more particularly to packages for semiconductor optical couplers.

BACKGROUND OF THE INVENTION

Optical couplers are devices which contain at least one optical emitter which is optically coupled to an optical detector through some sort of electrically insulating medium. This arrangement permits the passage of information from one electrical circuit which contains the emitter to another electrical circuit which contains the detector. A high degree of electrical isolation is maintained between the two circuits. Because information is passed optically across an insulating gap, the transfer is one way. That is, the detector cannot effect the input circuit. This feature is important because, for example, the emitter may be driven by a low voltage circuit using a microprocessor or logic gates, while the output photodetector may be part of a high voltage DC or AC load circuit. The optical isolation also serves to prevent damage to the input circuit caused by the relatively hostile output circuit.

Applications of this sort in which a low voltage circuit is coupled to a high voltage circuit are known as "interface" applications. Interface applications have stringent requirements for isolation voltage and minimum leakage current. As a result, optocouplers may have closely defined minimum physical dimensions for spacing between low voltage and high voltage sections. These requirements are intended to guarantee safety both for equipment and for humans, and as a result the requirements include dimensions for both electrical creepage and physical clearance.

A common optocoupler package format is the dual-in-line or DIP package. This package is widely used to house integrated circuits and was readily adapted to house optocouplers. Various versions of optocoupler DIP packages having 4, 6, 8 or 16 pins are commonly manufactured. However, the DIP package has the disadvantage that the spacing between optical emitter and optical detector is inherently limited by the size of the package. Accordingly, the internal dimensions available for electrical creepage and physical clearance are inherently limited.

According to the prior art, low cost optocoupler packages require that the device has its body molded after the process of mounting the semiconductor die and electrical connections are made. This process requires a batch processing system utilizing individual leadframes rather than a form of continuous processing. The optical path must be defined by a separate optically transmissive medium which is molded around the active devices and is then overmolded with resin or the like. This overmolded package provides physical protection, shields external light, and may also provide an integral reflective surface to aid in light transmission. The optically transmissive medium largely determines the optical performance of the assembled optocoupler. Voltage isolation thus depends on the dielectric characteristics of the optically transmissive medium and the method by which the insulation material (the optically transmissive medium) is placed within the optocoupler package. Typically a surface activation process is used to form a molecular bond between the optically transmissive medium and the surrounding mold compound in order to eliminate any path for high voltage creep. Variations in composition and amount of material applied in each unit also causes a large variation in the efficiency of the optocoupler from unit to unit.

Consequently, the need exists for a method to reduce the wide range of optical performance in variation and isolation voltage within an optocoupler while providing a low cost and easily manufactured package. It would be desirable to reduce assembly costs by eliminating expensive mold presses and surface activation equipment. Additionally, it would be desirable to provide packages suited for assembly in reeled form rather than batch lead form, and to use premolded packages for assembly.

DETAILED DESCRIPTION OF THE DRAWINGS

Figure 1:
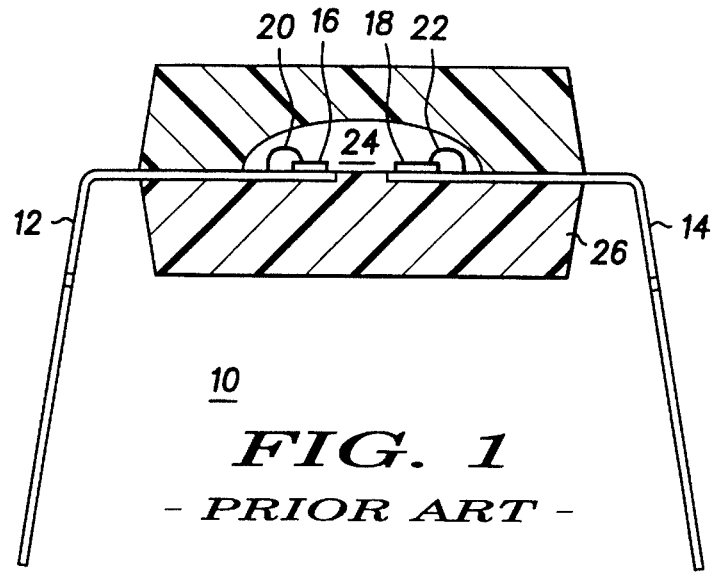
FIG. 1 shows a cross section view representing an optocoupler according to the prior art.

FIG. 1 shows a cross section of an optocoupler 10 in accordance with the prior art. Optocoupler 10 includes a lead frame comprising leads 12 and 14. Mounted on lead 12 is emitter 16. Typically, emitter 16 comprises a light emitting diode, often emitting in the infra red (IR) spectrum or frequency.

Mounted on lead 14 is detector 18. Typically, detector 18 comprises a phototransistor which generates an electrical signal in response to IR light generated by emitter 16.

Emitter 16 is electrically coupled to lead 12 on its bottom surface, and to another lead of the package (not shown) via wire bond 20. Similarly, detector 18 is electrically coupled to lead 14 on its bottom surface and to another lead of the package (not shown) via wire bond 22. It will be recognized by those skilled in the art that emitter 16 operates with two electrical connections, an anode and a cathode. These connections are thus provided by wire bond 20 and lead 12. Similarly, detector 18 operates with two electrical connections, typically an emitter and a collector. These connections are provided by wire bond 22 and lead 14. The base of detector 18 is driven by the light emitted by emitter 16.

Optocoupler 10 further includes optically transmissive medium 24, which typically comprises a droplet of silicone die coat gel. Additionally, optocoupler 10 includes molding compound 26, which encases the leadframe, emitter 16, detector 18, and optically transmissive medium 24.

The configuration of optocoupler 10 gives rise to a variety of disadvantages, including those discussed in the background section. More specifically, the optocoupler 10 requires an expensive over molding process whereby molding compound 26 encapsulates the other parts of the device. Additionally, voids tend to form within optically transmissive medium 24, and at the interface between medium 24 and molding compound 26. These voids give rise to inconsistencies in electrical characteristics, interference with optical transmission, reduction in electrical isolation, etc.

An additional disadvantage of optocoupler 10 is its low transmission efficiency due to the fact that it is a coplanar design. That is, emitter 16 and detector 18 sit on the same plane, rather than face each other. Consequently, less light is received by detector 18. The light transmission relies on reflections off the interface between medium 24 and molding compound 26.

One further disadvantage of the configuration of optocoupler 10 is that it is prone to failure from temperature cycling. This is because wire bonds 20 and 22 typically pass through two different materials, the die coat 24 and the molding compound 26. Temperature cycling creates different expansions in the respective materials, stressing the wires and their bonds, eventually resulting in breaking.

Figure 2:
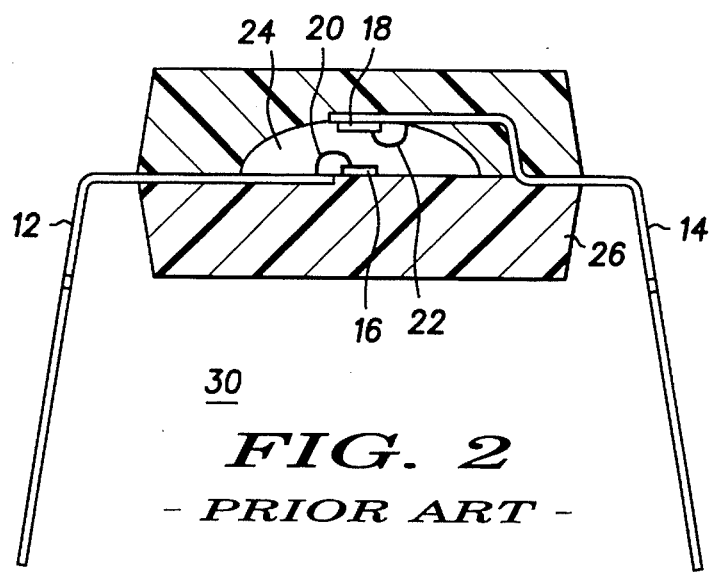
FIG. 2 shows a cross section view representing another optocoupler according to the prior art.

FIG. 2 shows a cross section view of a different optocoupler 30 in accordance with the prior art. Optocoupler 30 is very similar to optocoupler 10. The significant difference is that optocoupler 30 comprises an opposing configuration of emitter 16 and detector 18. The opposing configuration significantly increases transmission efficiency between the emitter and the detector. However, the opposing configuration introduces significantly more expense, difficulty in manufacture, and inconsistency in performance parameters. These new disadvantages are due mostly to the fact that it is difficult to manufacture such an opposing leadframe configuration because the overmolding process requires significantly more process steps. Furthermore, performance parameters become even more inconsistent because spacing between emitter 16 and detector 18 varies, and because the voids and other characteristics of optically transmissive medium 24 vary even more. The disadvantages arising from the configurations of optocoupler 10 and optocoupler 30 are substantially solved by the optocoupler package in accordance with the present invention.

Generally speaking, the optocoupler package in accordance with the present invention comprises two premolded thermoplastic halves; one containing the emitter and the other containing the detector. In the preferred embodiment, the emitter and the detector are mounted with an electrically conductive epoxy to respective silver plated copper lead frames that are already molded into the respective plastic halves. Thermosonic gold wire bonds complete the electrical connections from the die to other leads of the lead frame.

In the preferred embodiment, the detector package half has an open chamber, or "well" where the detector is located. The well is filled with silicon die coat gel which is applied or dispensed in a liquid form.

The emitter package half has a similar well containing the emitter. The well of the emitter package half is smaller than the well of the detector package half. Surrounding the well of the emitter package half is a protruding wall with relief vents. The wall is configured to fit into the perimeter of the well of the detector package half. When the package is assembled, the protruding wall of the emitter package half is inserted into the well of the detector package half. The insertion displaces some of the silicon die coat gel which had been dispensed into the well of the detector package half. As a result, the silicon die coat gel is forced upward into the well of the emitter package half. When fully engaged, the halves mate and the silicone die coat gel fills the now fully enclosed chamber. The relief vents formed in the protruding wall of the emitter package half allow excess silicone die coat gel to escape into the volume of the vents, and in some cases an insignificant amount into the area of the package outside the central chamber.

Subsequently, the silicone die coat gel is heat cured. The relief vents allow expansion of this silicone and, conversely, upon cooling, allow the silicone to retract through the vents due to its low tensile strength. The vents thereby prevent the formation of any voids, separations or other inconsistencies in the die coat gel which is the optically transmissive medium and electrical insulator. The package halves are finally sealed together with thermosonic welding around the perimeter.

It will be recognized that the emitter and detector could easily switch places in the respective package halves.

Consequently, as will be seen in particular detail in connection with the description of the figures that follow, the optocoupler in accordance with the present invention solves the problems of the prior art packages. The package in accordance with the present invention is inexpensive and easy to assemble because it is made from two premolded plastic pieces. The costly and complicated overmolding process is eliminated. Additionally, intrinsic voids in the optically transmissive silicone die coat gel are eliminated because gel always entirely fills the internal chamber, with excess being pushed out into the relief vents. Furthermore, very high transmission efficiencies are obtained because the emitter and detector face each other in an opposed design. Consistent electrical performance is achieved because there is no variation in emitter-detector spacing, die coat voiding, shape, or size, etc. Consistent voltage isolation is achieved for the same reasons. Additionally, the package in accordance with the present invention is more robust in the face of temperature cycling because wire bonds are contained only within single material, the silicone die coat gel.

Figure 3:
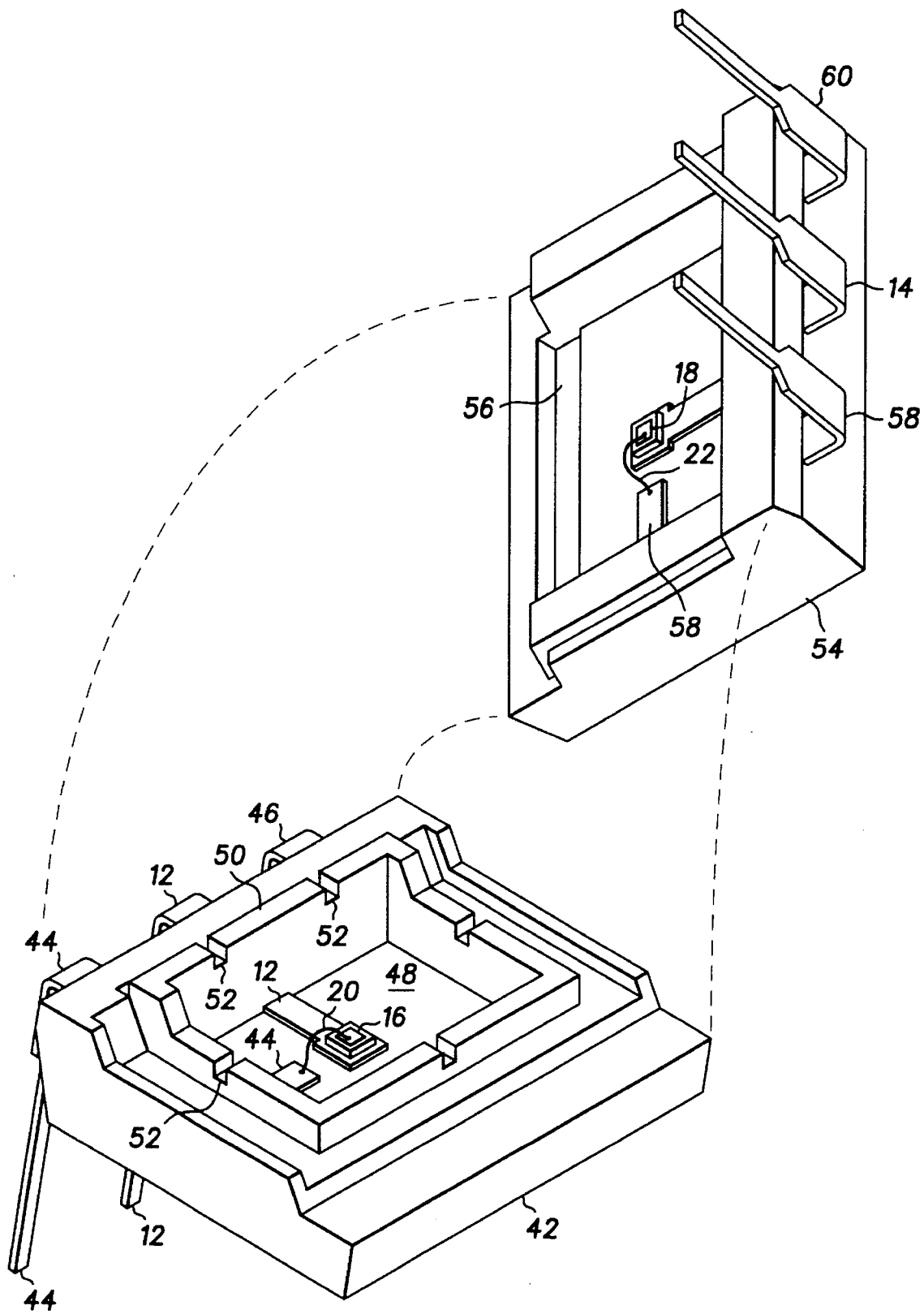
FIG. 3 shows a perspective view of two premolded portions of an optocoupler in accordance with the present invention.

Turning to the figures for a more specific understanding of the preferred embodiment, FIG. 3 shows a perspective view of the two portions of the optocoupler package 40 in accordance with the present invention. Package 40 comprises a first premolded half 42. Premolded half 42 may also be referred to as premolded protruding wall portion 42. Half 42 includes emitter 16. Emitter 16 typically comprises an LED emitting in the IR spectrum. Emitter 16 is attached to lead 12 of the leadframe molded into half 42. Typically, emitter 16 is attached to lead 12 with an electrically conductive epoxy. The other terminal of emitter 16 is attached to lead 44 via wire bond 20. Typically, wire bond 20 comprises a thermosonically bonded gold wire bond. It will be recognized by those skilled in the art that the typical emitter requires only two electrical connections, a cathode, and an anode. Consequently, the remaining lead 46 of premolded package half 42 remains disconnected. However, it will also be recognized that pinouts, number of pins, and the swapping of the emitter and detector in the respective halves, may vary according to the particular application requirements.

Premolded half 42 further includes well 48, in which emitter 16 is mounted. Well 48 is surrounded by protruding wall 50. Protruding wall 50 includes relief vents 52, distributed about the wall. Protruding wall 50 is shaped to fit inside the perimeter of the well of the other premolded half 54, as will be discussed in more detail below. It will be recognized that other configurations of relief vents may be readily used, being located in other parts of the protruding wall or even other parts of the package entirely.

Optocoupler 40 further includes a second premolded half 54, which may also be referred to as a premolded well portion. Premolded half 54 includes well 56 which has a larger perimeter than well 48 of premolded half 42. Mounted within well 56 is detector 18. Typically, detector 18 comprises a phototransistor. Detector 18 is mounted on lead 14 of the leadframe molded into premolded half 54. Additionally, another electrode of detector 18 is wire bonded, via wire bond 22, to lead 58. It will be recognized that such a photodetector typically operates by having external leads connected to its collector and emitter, the light emitted from emitter 16 acting as the base drive. Consequently, in an application requiring a six pin DIP like the package 40, the remaining lead 60 of premolded half 54 is not connected.

Figure 4:
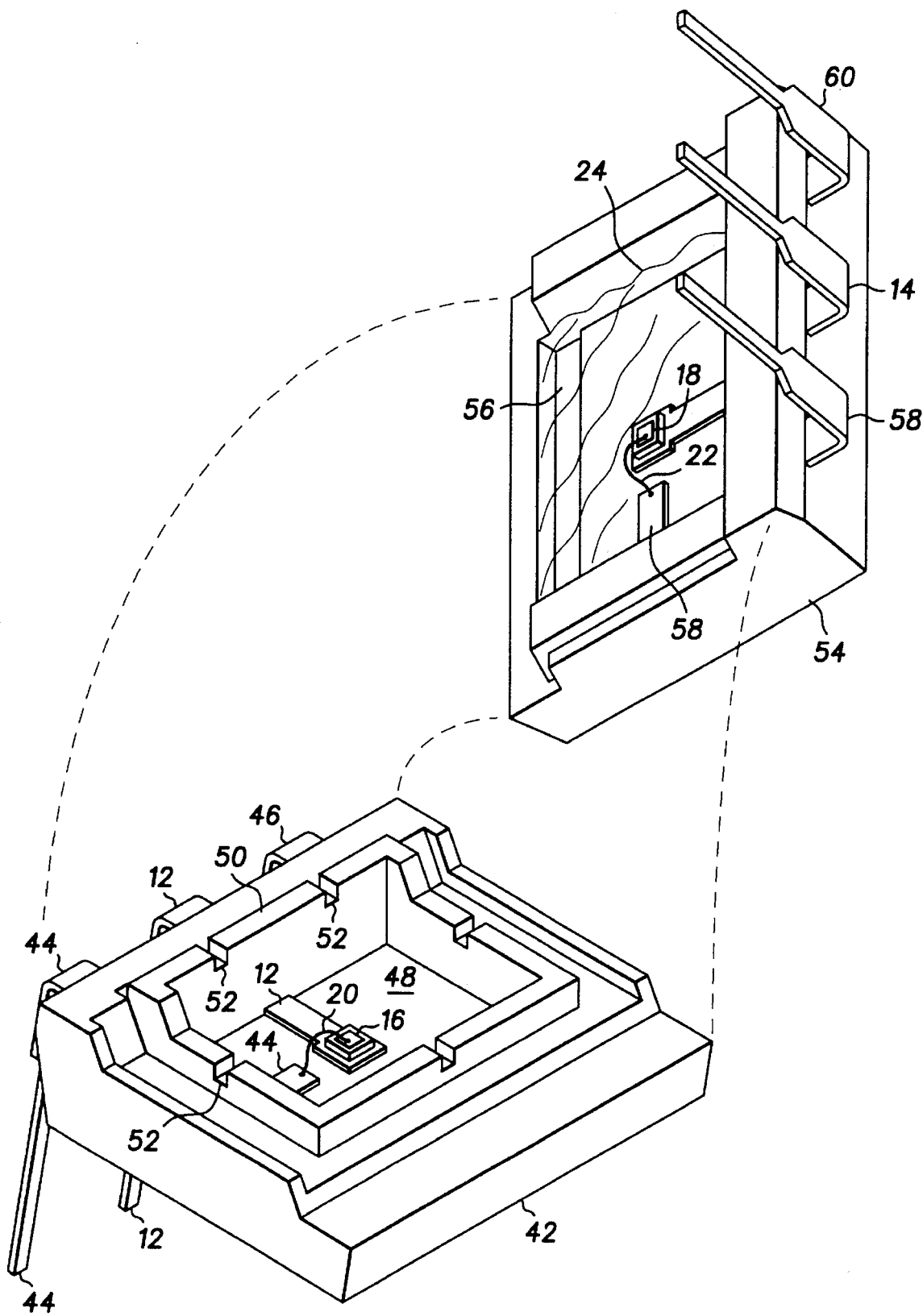
FIG. 4 shows a perspective view of the two portions illustrated in FIG. 3, further including silicone gel filling a well in one of the portions.

Turning to FIG. 4, FIG. 4 illustrates a further step in the manufacture of optocoupler 40. Specifically, FIG. 4 shows silicone die coat gel 24, in liquid or uncured form, which has been dispensed in well 56. It will be recognized by those skilled in the art that precisely controlled quantities of silicone die coat gel 24 may be dispensed, as required by the configuration of the package. Silicone die coat gel 24 serves as an optically transmissive medium which allows light to pass from emitter 16 to detector 18, while providing electrical isolation between half 42 and half 54 of the package. Proceeding further with the manufacture of optocoupler package 40, premolded half 42 is inserted into, or mated with, premolded package half 54. Protruding wall 50 fits just inside well 56 and displaces a predetermined portion of optically transmissive medium 24. Once the two halves are mated, an internal chamber is formed by well 48 in combination with well 56. As will be illustrated in more detail with reference to FIGS. 5 and 6, optically transmissive medium 24 entirely fills the internal chamber.

It may be noted that the surface, well, and walls of premolded halves 42 and 54 have relatively complicated shapes. For example, premolded half 42 and its protruding wall 50 have a step shape. This design forces the gel 24 to be displaced in a predetermined and controllable direction when halves 42 and 54 are mated. Additionally, it will be recognized that these shapes are conducive to easy molding and assembly. It will also be recognized that a variety of configurations may be used, based upon the principles discussed and disclosed here.

It should be recognized by those in the field that the plastic used for halves 42 and 54 preferably provide internal reflective surfaces to improve efficiency of light transferal within the device.

Figure 5:
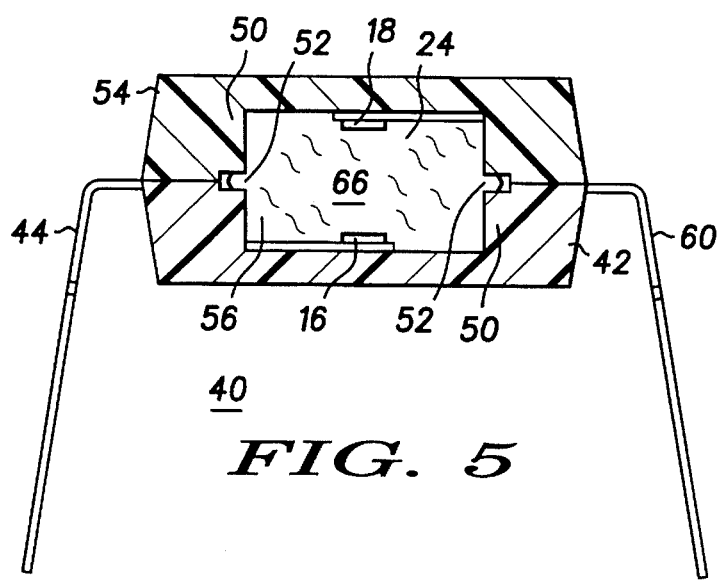
FIG. 5 shows a cross section view representing an optocoupler in accordance with the present invention.

FIG. 5 is a simplified cross section of the assembled optocoupler package 40. Certain elements and details have been left out for the sake of clarity. Nevertheless, reference numbering remains consistent between the elements of FIG. 5 and analogous elements of the other figures. Note that relief vents 52 are now shown in the center of wall 50 for the sake of demonstration and clarity. As discussed above, a variety of configurations are appropriate.

FIG. 5 illustrates premolded package 40 including protruding wall 50 engaged into the perimeter of well 56. Consequently, the mating of premolded half 42 with premolded half 54 creates an extremely well defined and consistent internal area, chamber, or cavity 66. An important feature to recognize is that optically transmissive medium 24 will always entirely fill chamber 66. Additionally, an important characteristic is that medium 24 partially spills out into relief vents 52. As discussed above, methods for dispensing precise quantities of medium 24 are well known. Consequently, in the preferred embodiment, an exact amount of medium 24 is used such that after medium 24 is heat cured, medium 24 occupies only a portion of relief vents 52, allowing for expansion and contraction.

Figure 6:
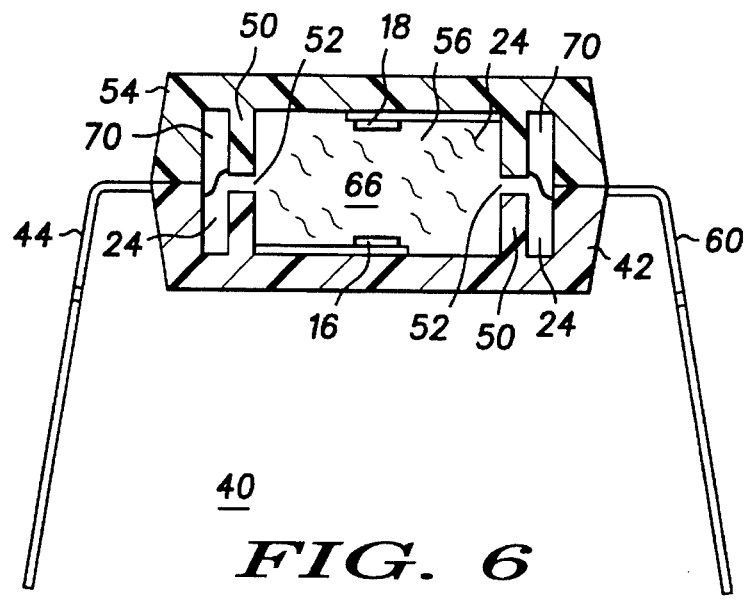
FIG. 6 shows a cross section view of another optocoupler in accordance with the present invention.

FIG. 6 shows the same view as FIG. 5, but for an alternative configuration. The protruding wall 50 of premolded half 42 of the package of FIG. 6 lies, at least in some portions, within the perimeter of well 56 of premolded half 54. The configuration results in a predetermined amount of space 70 between wall 50 and the perimeter of well 56. According to the configuration of the package shown in FIG. 6, an amount of optically transmissive medium 24 is used such that some spills all the way out of relief vents 52 into space 70 between wall 50 and the remainder of the package. Once cured, medium 24 can expand and contract within space 70, preventing voids, changes in density, separation, etc. from occurring within chamber 66.

Figure 7:
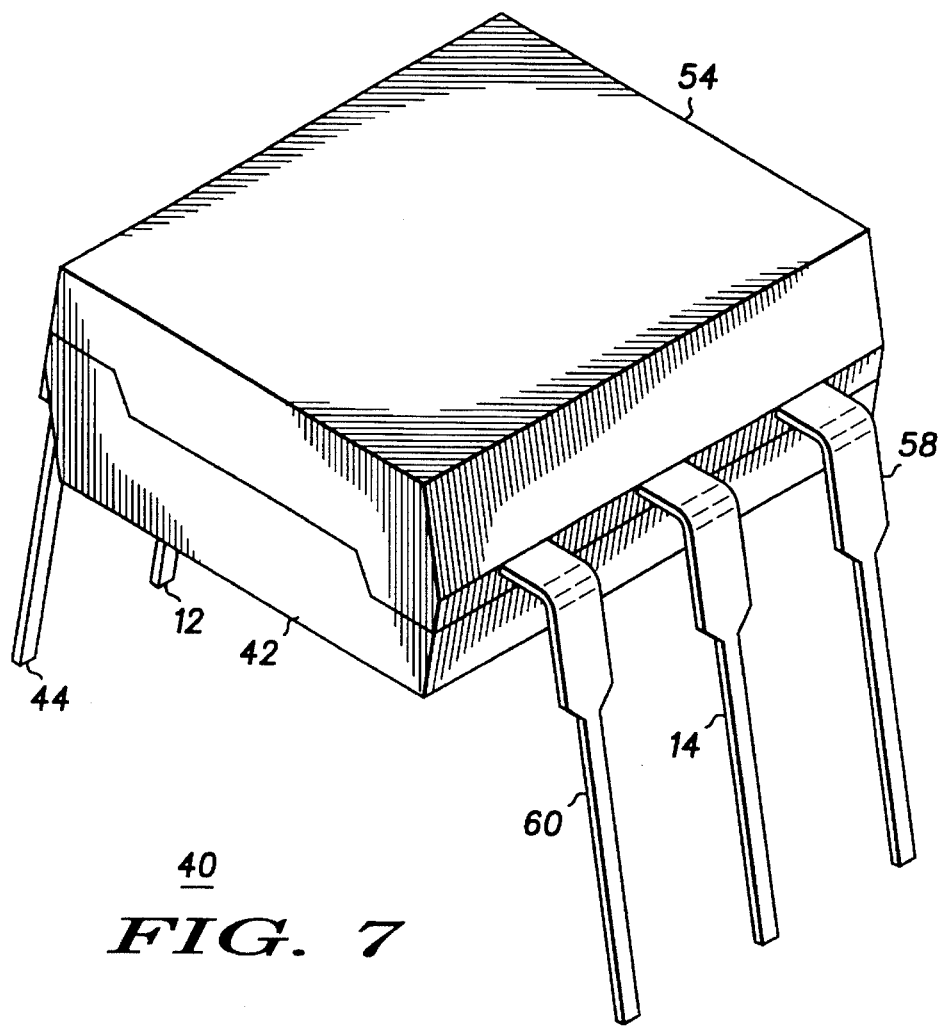
FIG. 7 shows a perspective view illustrating the optocoupler represented in FIGS. 3 and 4, after assembly is complete.

Turning to FIG. 7, FIG. 7 illustrates the fully assembled optocoupler 40. As discussed above, premolded halves 42 and 54 have been thermosonically welded to one another to form a near-hermetic package. Optocoupler package 40 conforms to a standard six pin DIP form factor.

It will be recognized, in view of the foregoing, that an advantageous optocoupler package is disclosed. The inventive package utilizes premolded plastic halves rather than an expensive overmolding process. The package eliminates inconsistencies in size, shape, density, voids and separations in the optical transmissive medium/insulator (typically die coat) within the optocoupler. The inventive package provides high efficiency transmission due to an opposed design, wherein the emitter faces the detector. Due to these and other advantages, the optocoupler packages provide consistent and uniform electrical performance and voltage isolation performance. Additionally, the package is more robust in the face of temperature cycling, due to the fact that wire bonds remain within a single material.

We claim:

1. A method for making an optocoupler package comprising the steps of:

providing a first premolded half, the first premolded half including an emitter;

providing a second premolded half, the second premolded half including a detector;

mating the first premolded half and the second premolded half such that the emitter faces the detector; and providing a relief vent in the optocoupler package.

2. The method of claim 1, further comprising the step of thermosonically welding the first premolded half to the second premolded half.

3. The method of claim 1, wherein the step of providing the second premolded half includes providing a well in the second premolded half, and wherein the method further includes the step of filling the well with an optically transmissive medium.

4. The method of claim 3, wherein the step of filling comprises filling with a silicone die coat gel in liquid form.

5. The method of claim 3, wherein the step of providing the first premolded half includes the step of providing a protruding wall shaped to fit inside a perimeter of the well, the first premolded half also including the relief vent, and wherein the step of mating comprises the steps of forming a device chamber and displacing the optically transmissive medium such that the optically transmissive medium fills the device chamber and spills into the relief vent.

6. The method of claim 3, wherein the step of providing the first premolded half includes the step of providing a protruding wall protruding from the first premolded half, the protruding wall configured to fit inside a perimeter of the well, the protruding wall including the relief vent, and wherein the step of mating comprises the steps of forming a device chamber and displacing the optically transmissive medium such that the optically transmissive medium fills the device chamber and spills into the relief vent.

7. The method of claim 6, further comprising the step of thermosonically welding the first premolded half to the second premolded half.

8. The method of claim 3, further comprising the step of heat curing the optically transmissive medium.

9. The method of claim 8, further including the step of expanding the optically transmissive medium into the relief vent during the heat curing step.

10. An optocoupler package comprising:
 a premolded first half including a detector;
 a premolded second half including an emitter located in a second half well, the premolded first half mated with the premolded second half thereby forming a sealed package, the detector and the emitter aligned facing one another, the detector and the emitter being mounted on respected opposing surfaces;
 an optically transmissive medium completely occupying a central cavity within the sealed package: and
 a relief vent coupled to the central cavity.

11. The optocoupler package of claim 10, wherein a portion of the optically transmissive medium occupies a portion of the relief vent.

12. The optocoupler package of claim 10, wherein the premolded first half is thermosonically welded to the premolded second half.

13. The optocoupler package of claim 10, wherein the optically transmissive medium comprises heat cured silicone die coat gel.

14. The optocoupler package of claim 10, wherein the emitter emits an infra red frequency and the detector generates an electrical signal in response to receiving the infra red frequency.

15. A method for making an optocoupler package comprising the steps of:
 providing a premolded well portion of the optocoupler package, the premolded well portion shaped to define a central trough;
 filling the central trough with an optically transmissive medium;
 providing a premolded protruding wall portion of the optocoupler package, the premolded protruding wall portion comprising a protrusion shaped to mate with the central trough; and
 mating the premolded well portion with the premolded protruding wall portion, the protrusion displacing a portion of the optically transmissive medium, forcing the optically transmissive medium into at least one relief vent.

16. The method of claim 15, further comprising the step of heat curing the optically transmissive medium.

17. The method of claim 16, further comprising the step of thermosonically welding the premolded well portion together with the premolded protruding wall portion.

18. The method of claim 15, wherein the step of providing the premolded well portion includes providing a phototransistor and wherein the step of providing a premolded protruding wall portion includes providing a light emitting diode, and wherein the step of mating comprises aligning the phototransistor and the light emitting diode so as to face one another.

19. The method of claim 15, wherein the step of providing the premolded well portion includes providing a light emitting diode, wherein the step of providing the premolded protruding wall portion comprises providing a phototransistor, and wherein the step of mating comprises aligning the light emitting diode and the phototransistor so as to face one another.

20. A method for making an optocoupler package comprising the steps of:
 providing a first premolded half, the first premolded half including a detector;
 providing a second premolded half, the second premolded half including an emitter;
 mating the first premolded half with the second premolded half such that the detector faces the emitter: and
 providing a relief vent in the optocoupler package.

21. The method of claim 20, wherein the step of providing the second premolded half includes providing a well in the second premolded half, and wherein the method further includes the step of filling the well with an optically transmissive medium.

22. The method of claim 21 wherein the step of providing the first premolded half includes the step of providing a protruding wall protruding from the first premolded half, the protruding wall configured to fit inside a perimeter of the well, the protruding wall including the relief vent, and wherein the step of mating comprises the steps of forming a device chamber and displacing the optically transmissive medium such that the optically transmissive medium fills the device chamber and spills into the relief vent.

23. An optocoupler package comprising:
 a premolded first half including an emitter;
 a premolded second half including a detector located in a second half well, the premolded first-half-mated with the premolded second half thereby forming a sealed package, the detector and the emitter aligned facing one another, the detector and the emitter being mounted on respected opposing surfaces;
 an optically transmissive medium completely occupying a central cavity within the sealed package; and
 a relief vent coupled to the central cavity.

\* \* \* \* \*

UNITED STATES PATENT AND TRADEMARK OFFICE
CERTIFICATE OF CORRECTION

PATENT NO. : 5,545,893
DATED : August 13, 1996
INVENTOR(S) : Clem H. Brown
John E. Salina It is certified that error appears in the above-indentified patent and that said Letters Patent is hereby corrected as shown below:

Claim 10, column 7, line 22
Delete "respected" and insert --respective-- therefor.

Claim 23, column 8, line 50
Delete "respected" and insert --respective-- therefor.

Signed and Sealed this

Twenty-first Day of October 1997

Attest:

Attesting Officer

BRUCE LEHMAN

Commissioner of Patents and Trademarks